July 6, 1965 G. R. MARTNER 3,193,781
OSCILLATOR HAVING OUTPUT FREQUENCIES SELECTABLE BY COMBINATIONS OF BILEVEL VOLTAGE SIGNALS
Filed Jan. 3, 1962
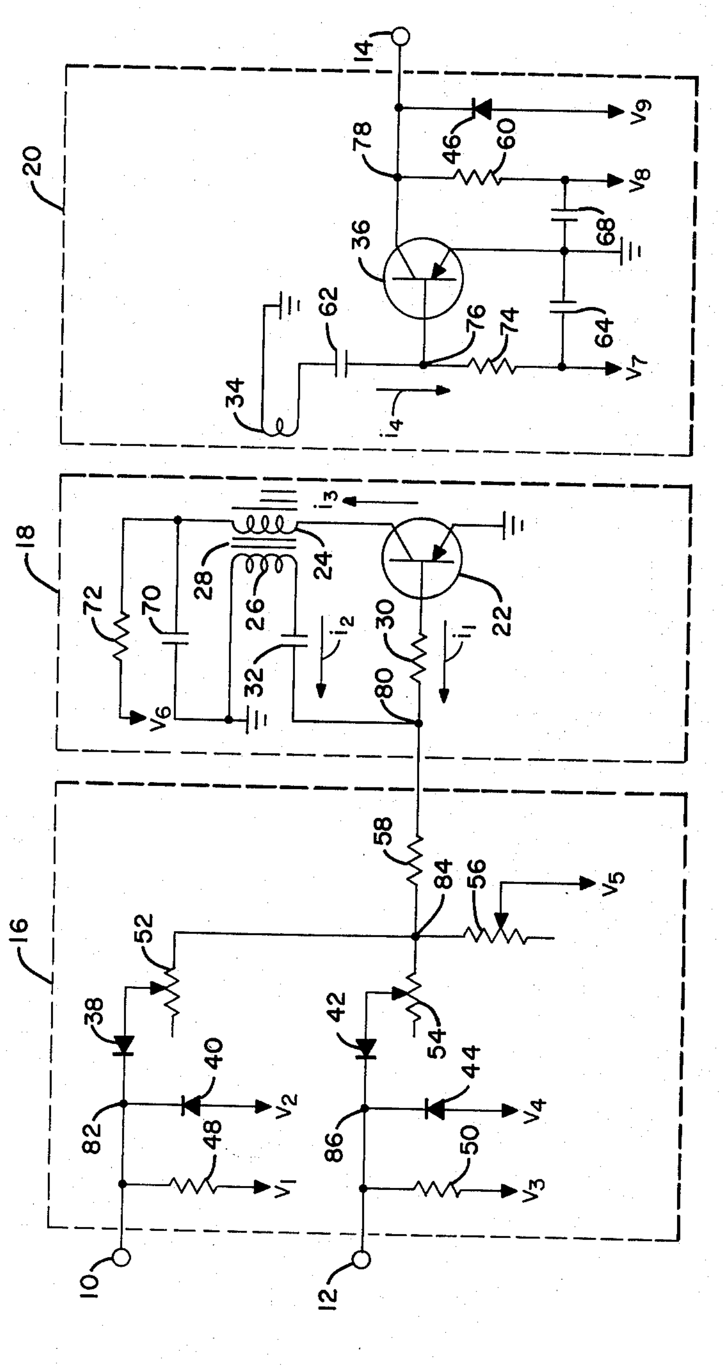
INVENTOR
GLEN R. MARTNER
BY Herbert F. Sonnemeyer
ATTORNEY 3,193,781
OSCILLATOR HAVING OUTPUT FREQUENCIES SELECTABLE BY COMBINATIONS OF BILEVEL VOLTAGE SIGNALS

Glen R. Martner, Hawthorne, Calif., assignor to Sperry Rand Corporation, New York, N.Y., a corporation of Delaware Filed Jan. 3, 1962, Ser. No. 164,059
7 Claims. (Cl. 331—112)

This invention relates in general to oscillators and in particular to a blocking oscillator which is capable of providing an output signal of a plurality of remotely determinable frequencies.

A blocking oscillator is a transformer-coupled oscillator having a broad band feedback path and being capable of producing large amplitude pulses having widths of approximately 0.05 to 25 microseconds. Such an oscillator possesses the desirable characteristic of having the active element nonconducting except during the period of pulse generation thus allowing high peak power output at a low value of average power. Further, it can be either monostable in which a triggering signal is required to initiate the pulse generation or astable in which the circuit is free-running and produces pulses at a fixed repetition frequency. One difficulty encountered in the design of a blocking oscillator is that the path of operation of the active element is very difficult to describe accurately because of the effects of circuit capacitances, transformer leakage inductance, and the lack of active element characteristics covering the operation of the active element at high control electrode voltages and currents. As a result, the design of a blocking oscillator having certain prescribed characteristics is normally based on empirical data and the exact pulse widths, rise times, and amplitudes are determined experimentally. A good discussion of the theory of operation of a blocking oscillator circuit may be found in "Pulse and Digital Circuits," Millman and Taub, McGraw-Hill, pages 272–284.

The invention disclosed herein provides an astable blocking oscillator which is capable of providing an output signal of a plurality of frequencies, which frequencies are a function of a plurality of combinations of two discrete voltage levels which are impressed upon a plurality of input terminals. The effect of the imposition of the combinations of the two discrete voltage levels which are representative of a logical "1" or "0" upon the plurality of input terminals is to forward bias or reverse bias certain associated diodes so as to effectively alter the resistance of the discharge path of the capacitor of the feedback circuit associated with the base-collector junction.

Accordingly, a primary object of this invention is to provide an oscillator which is capable of providing high power, short duration pulses of a predetermined and variable frequency.

Another object of this invention is to provide an oscillator which is capable of providing an output signal having a plurality of remotely selectable stable frequencies.

Another object of this invention is to provide an oscillator which has the capability of providing a plurality of stable output frequencies upon imposition from remote control means of discrete combinations of readily available bi-level logic signals.

Another object of this invention is to provide an oscillator whose base-collector feedback circuit capacitor discharge path resistance is varied by the forward or reverse biasing of associated diode-resistor combinations.

A still further object of this invention is to provide a tape write oscillator which is capable of recording data at a plurality of remotely selectable bit densities.

These and other more detailed and specific objectives will be disclosed in the course of the following specification, reference being had to the accompanying drawings in which:

The illustrated circuit is an exemplary embodiment of this invention wherein there is illustrated a blocking oscillator circuit providing any one of three different frequency output signals as a function of combinations of bi-level voltage inputs on a two ended parallel input circuit.

As stated above, the invention disclosed herein provides an oscillator in which the tuning of the base-collector feedback circuit is achieved by the forward or reverse biasing of associated diode-resistance combinations. By remotely selecting various resistance values, a myriad of frequency combinations may be obtained. In the illustrated embodiment the respective component values and voltage levels were selected so as to provide write signals for magnetic tape operations at frequencies of 12.5 kc., 20 kc., and 25 kc.

An exemplary embodiment of the invention disclosed herein is illustrated in the single figure. On impressing combinations of two discrete signal levels representative of a logical "1" or "0" upon input terminals 10 and 12 there are provided at output terminal 14 three output signals. Each of these signals has a discrete frequency which is representative of the particular combination of "1" and "0" impressed upon input terminals 10 and 12.

This embodiment may be thought of as consisting of three essential parts: input means 16, blocking oscillator 18 and output means 20. Blocking oscillator 18 initiates the signal pulse through the interaction of the feedback loop consisting of transistor 22, windings 24 and 26 of transformer 28, resistor 30 and capacitor 32, upon initial application of power. Input means 16, by providing a low resistance path for the discharge of capacitor 32, upon the saturation of transistor 22, provides a proper base-emitter bias establishing the cutoff point of transistor 22 and consequently the output signal pulse repetition rates. Output means 20 establishes a constant load upon blocking oscillator 18 through winding 34 of transformer 28 and provides the output signal at output terminal 14.

In order to facilitate an understanding of the operation of this invention, the following group of actual values for the components of the illustrated embodiment are presented. It should be understood that the principles of operation of this circuit may be present in circuits having a wide range of individual specifications, so that the list of values here presented should not be construed as a limitation.

| Components: | Type number or identification |
|---|---|
| Transistor 22 and 36 | Philco T–2382. |
| Diode 38, 40, 42, 44 and 46 | Clevite CGD–867. |
| Transformer 28 | Remington Rand Univac Part No. 4000102–02. |
| Resistor 48, 50 | 3.92K ¼ w. ±1%. |
| Resistor 52 | 20K ¼ w. |
| Resistor 54, 56 | 50K ¼ w. |
| Resistor 58 | 13.3K ⅛ w. ±1%. |
| Resistor 30 | .332K ⅛ w. ±1%. |
| Resistor 60 | 2.61K ¼ w. ±1%. |
| Resistor 72 | 56 ohms ⅛ w. ±5%. |
| Resistor 74 | 1.43K ⅛ w. ±1%. |
| Capacitor 32 | 0.01 microfarad ±5%. |
| Capacitor 64, 68 | 0.01 microfarad −20% +80%. |
| Capacitor 70 | 0.33 microfarad ±20%. |
| $V_1, V_3, V_8$ | −15 v. ±3%. |
| $V_2, V_4, V_5, V_6, V_7, V_9$ | −3 v. ±3%. |

Using the above values, the following signal relationships are utilized:

Output:

(A) Normal D.C. level —0.5 to 0.1 volt (B) Pulse characteristics (1) $-3.3\pm0.2$ volt (2) $25\times10^{-9}$ seconds rise and fall time unloaded (3) Fall time less than $10\times10^{-9}$ seconds under $30\times10^{-3}$ ampere load (4) Rise time less than $35\times10^{-9}$ seconds under $30\times10^{-3}$ ampere load (5) Pulse width 150 to $330\times10^{-9}$ seconds (6) Pulse repetition rate variation, less than 3% with (a) $\pm3\%$ variation in supply voltages (b) Nominal ground potential input level variation —0.5 to +2.0 volts Input:

(A) Signal level representative of a logical "1"= ground potential (B) Signal level representative of a logical "0"= —3.0 volts When the circuit of the illustrated embodiment is initially energized by the coupling thereto of the reference potentials $V_1$ through $V_9$ the amplitude of current $i_1$ flowing in the base circuit of transistor 22 rises rapidly through input circuit 16 due to the forward biasing of the base-emitter junction caused by the current due to the application of $V_5$ and $V_6$. Current flow in the collector circuit as exemplified by current $i_3$ increases in accordance with this base driving current $i_1$ and $V_6$ with load resistor 72 limiting current $i_3$ to a safe level and with by-pass capacitor 70 by-passing the fluctuating portion of current $i_3$ to ground. As the collector current $i_3$ flowing through winding 24 of transformer 28 increases, a voltage which becomes more negative is induced in winding 26 of transformer 28. The current $i_2$ generated by this voltage charges capacitor 32 through the negligible forward resistance of the base-emitter junction of transistor 22 due to its being forward biased by the action of $V_5$. This voltage appears across the base-emitter junction of transistor 22 which in turn further increases the forward bias of the base-emitter junction. Regeneration through the action of the flow of currents $i_1$ and $i_2$ continues rapidly until transistor 22 is saturated. At saturation collector current $i_3$ becomes constant which results in a zero induced voltage in winding 26 due to the zero voltage variation through winding 24. As there is no induced voltage in winding 26 a charging potential is no longer applied across capacitor 32. Capacitor 32 then begins discharging across the impedance presented by input circuit 16. The field about winding 26 then collapses about itself and it induces a voltage in winding 26 in the reverse direction to that of the charging current $i_2$. This causes the base-emitter junction to become reverse biased forcing base-collector current to decrease to zero. Transistor 22 is held at cutoff until capacitor 32, which discharges through the impedance presented by input circuit 16, reaches the point at which the base-emitter junction is again forward biased, at which time conduction begins anew. The output waveform across winding 24 is a pulse the width of which is primarily determined by winding 26 while the time between pulses, or pulse repetition rate, is determined by the RC time constant of the impedance presented by input circuit 16 and of capacitor 32. In the illustrated embodiment the turns ratios of the windings of transformer 28 are $$\frac{N_{24}}{20}:\frac{N_{26}}{10}:\frac{N_{34}}{8}$$

where N represents the number of turns of windings 24, 26, or 34 of transformer 28.

In order to maintain a constant pulse width output circuit 20 is utilized. When a zero voltage is induced in winding 34 due to a zero variation of current $i_3$ flowing through winding 24 the base-emitter junction of transistor 36 is forward biased due to the action of the negative voltage $V_7$ being impressed upon the base of transistor 36 through resistor 74. With transistor 36 base-emitter junction forward biased, the output signal at terminal 14 is at ground potential due to the negligible resistance drop across the emitter-collector junction of transistor 36 with the emitter of transistor 36 grounded in the grounded emitter configuration.

A pulse caused by the variation of current $i_3$ flowing through winding 24 induces a positive voltage in winding 34 of transformer 28 whose amplitude is a function of the turns ratio of windings 24 and 34 of transformer 28. The positive signal induced in winding 34 is differentiated by capacitor 62 to produce a positive going pulse flowing through resistor 74 toward voltage source $V_7$. The positive pulse at base 76 of transistor 36 reverse biases the base-emitter junction of transistor 36 rapidly driving transistor 36 into cutoff. Driving transistor 36 reverse biases the base-emitter junction of transistor 36 rapidly driving transistor 36 into cutoff. Driving transistor 36 to cutoff causes the emitter-collector junction of transistor 36 to appear as a high impedance or effectively an open circuit at collector 78 of transistor 36. Voltage source $V_8$ is then coupled to output terminal 14 through resistor 60 which forward biases diode 46 clamping output terminal 14 to a voltage level of $V_9$, or —3 volts. Terminal 14 remains at —3 volts as long as the emitter-collector junction of transistor 36 is effectively an open circuit as caused by the flow of current $i_4$ through the base drive circuit of transistor 36. The discharge path of capacitor 62 through resistor 74 to $V_7$ is selected in this embodiment to have such an RC time constant as to hold transistor 36 in cutoff for a period between 150 to $330\times10^{-9}$ seconds. The positive pulse from winding 34 must be greater than 330 nanoseconds to ensure that the output pulse at 14 is independent of the pulse width of the oscillator which will vary with frequency. This the output pulse width will depend on the RC time constant of capacitor 62 and resistor 74.

As stated above, the pulse repetition rate of the signal present at terminal 14 is a function of the impedance presented by input circuit 16 to the charge stored in capacitor 32. In its simplified form, this function is represented by the well known equation:

$$i=\frac{E}{R}e^{\frac{-t}{RC}}$$

where:

$i$ is the instantaneous value of current discharging through resistance R;

R is the resistance of the path through which the current $i$ must discharge;

E is the voltage across capacitor C at time $t_0$;

C is the capacitance of capacitor C;

$t$ is the time after time $T_0$ capacitor C is discharging through resistor R;

$e$ is the base of the natural logarithm.

With the effective resistance of input means 16 designated by the symbol R in the above equation, and as the operating characteristics of transistor 22 are a function of the base-to-emitter junction voltage, it can be seen that the turn-off characteristics of transistor 22 are a function of $i\times R$. Thus, by providing a means to vary R, it is seen that it is possible to vary the time required to permit capacitor 32 to discharge through the equivalent resistance R of input means 16 until transistor 22 base-emitter junction bias reaches cutoff potential, at which time transistor 22 ceases conduction. As $i\times R$ establishes the base-emitter junction bias, the use of a large R provides a relatively long discharge time or stated another way, increasing the resistance of the discharge path of capacitor 32 through the effective resistance of input means 16, increases the time necessary to provide that base-emitter bias which will cause transistor 22 to cutoff and to repeat the cycle of charging capacitor 32 through the feedback loop of windings 24 and 26 of transformer 28, capacitor 32 and resistor 30.

As is well known, and as discussed above, the pulse repetition rate of an astable blocking oscillator such as oscillator 18 is determined principally by the discharge RC time constant of the base-collector circuit represented by capacitor 32 and the equivalent resistance R of input means 16 as seen at point 80. However, since capacitor 32 partly determines the pulse width as well as the discharge time, the particular values of capacitor 32 and equivalent resistance R are best determined experimentally. If capacitor 32 is so large that its voltage does not change during the pulse, the pulse width is determined by transformer 28 alone. As the value of capacitor 32 is decreased, the charge gained during the pulse duration causes its voltage to rise. Since the blocking oscillator base bias is the difference between the capacitor voltage and the voltage across winding 26 of transformer 28, a rise of capacitor voltage causes the base voltage to fall faster than when the action depends on the transformer alone. This action shortens the pulse duration. The voltage across capacitor 32 must be allowed some increase because it becomes the initial voltage from which capacitor 32 must discharge during the interval between pulses. The value of capacitor 32 of 0.01 microfarad was determined to be suitable in most cases. The value of capacitor 32 has no effect on the rise time of the pulse and negligible effect on its amplitude.

Since R is large compared to the internal base-emitter resistance of transistor 22 when the base-emitter junction is reverse biased, it does not affect the charging capacitor 32. The value of R can be chosen solely on the basis of the discharge time constant required for the given pulse repetition rate. In the illustrated embodiment, the respective resistor values were selected so as to provide write signals for magnetic tape write operations at frequencies of 12.5 kc., 20 kc., and 25 kc.

Input means 16 consist of three parallel resistance paths coupled at point 84 to have a serial arrangement with resistor 58, the other end of which is coupled to point 80. The relationship of the resistances of the parallel paths of input means 16 to the equivalent resistance R of input means 16 with terminals 10 and 12 at —3 volts and as seen at point 80 may be expressed as follows:

$$R=R_{58}+\frac{1}{\frac{1}{R_{56}}+\frac{1}{R_{10}}+\frac{1}{R_{12}}}$$

where:

$R$=equivalent resistance of input means 16 as seen from point 80;

$R_{10}$=equivalent resistance of the circuit of input terminal 10 to point 84;

$R_{12}$=equivalent resistance of the circuit of input terminal 12 to point 84;

$R_{56}$=equivalent resistance of the circuit of $V_5$ through resistor 56 to point 84;

$R_{58}$=resistance of resistor 58.

As discussed above, the RC time constant of capacitor 32 and R determine the pulse repetition rate of the circuit of the illustrated embodiment wherein the switching in or out of a combination of one or more of the above parallel paths designated $R_{10}$ and $R_{12}$ varies the pulse repetition rate accordingly. The technique of the switching in or out of these parallel paths as follows.

Input terminals 10 and 12 are coupled to conventional diode OR circuits well known in the art. The circuits of resistor 48 and diode 40 of input terminal 10 and of resistor 50 and diode 44 of input terminal 12 act as clamping circuits to their respective diodes 38 and 42.

The cathodes of diodes 38 and 42 are thus clamped to a minimum voltage of slightly less than —3 volts due to the voltage drop across diodes 40 and 44 to the —3 volt supply of $V_2$ and $V_4$, respectively. Under this condition the conduction or non-conduction of diodes 38 and 42 is controllable by the signal level at input terminals 10 and 12, respectively. As an example, if a logical "1" of 0 volt is coupled to input terminal 10, diode 38 is reversed biased into non-conduction causing the circuit associated with input terminal 10 to appear as a high impedance or essentially open circuit. Conversely, if a logical "0" of —3 volts is coupled to input terminal 10, diode 38 is forward biased into conduction causing the circuit associated with input terminal 10 to appear as an equivalent resistance $R_{10}$.

Remembering that the illustrated embodiment with the above listed components is designed to operate with bi-level input signals of ground potential and —3.0 volts representative of a logical "1" and "0," respectively, the following circuit functions occur. Impressing a "1" on input terminal 10 grounds point 82 which with $V_5$ equal to —3 volts reverse biases diode 38. Reverse biasing diode 38 causes the input terminal 10 to appear as an open circuit to point 80. Simultaneously impressing a "0" upon input terminal 12 places point 86 at a potential level of —3.0 volts which with $V_5$ equal to —3 volts forward biases diode 42. Forward biasing diode 42 causes $R_{12}$ to be parallel with $R_{56}$. The result of this is that R, the equivalent resistance of input means 16, as seen from point 80, and as defined in the above equation, is modified by the elimination of the factor $R_{10}$. In a similar manner, it can be seen that the three combinations of "1" and "0" upon input terminals 10 and 12 produce the following respective modified equations for R with the corresponding variation in pulse repetition rate.

| Terminal 10 | Terminal 12 | R | Pulse repetition rate, kilocycles |
|---|---|---|---|
| "1" | "1" | $R=R_{56}+R_{58}$ | 12.5 |
| "0" | "1" | $R=R_{58}+\frac{R_{56}\times R_{10}}{R_{56}+R_{10}}$ | 25.0 |
| "1" | "0" | $R=R_{58}+\frac{R_{56}\times R_{12}}{R_{56}+R_{12}}$ | 20.0 |

In setting up the apparatus of the illustrated embodiment a certain procedure is recommended. Initially, with terminals 10 and 12 grounded variable resistor 56 is adjusted to achieve an output pulse repetition rate of 12.5 kc. Subsequently, either variable resistor 52 or 54, with terminal 12 or 10, respectively, grounded may be adjusted to achieve an output pulse repetition rate of 25 kc. or 20 kc., respectively.

It is understood that suitable modifications may be made in the structure as disclosed provided such modifications come within the spirit and scope of the appended claims. Having now, therefore, fully illustrated and described my invention, what I claim to be new and desire to protect by Letters Patent is:

1. A pulse generator comprising:

an active element having at least three electrodes;

feedback means coupling a first and a second of said electrodes;

means coupling the third of said electrodes to a reference potential;

said feedback means including a capacitor means;

input means comprising a plurality of parallel arranged impedance means common coupled at one end to said first electrode;

output means coupled to said feedback means;

each of said parallel arranged impedance means comprising serially arranged diode means and first resistor means;

a second resistor means coupling the common coupled end of said parallel arranged impedance means to a source of potential;

said parallel arranged impedance means and said second impedance means forming parallel discharge paths for said capacitor means;

each of said parallel arranged impedance means adapted for receiving alternative first and second different voltage level digital signals;

said first signal when coupled to its associated parallel arranged impedance means causing said associated diode to be reverse biased causing said associated impedance means to appear to said capacitor means as an infinite impedance discharge path;

said second signal when coupled to its associated parallel arranged impedance means causing said associated diode to be forward biased causing said associated impedance means to appear to said capacitor means as an impedance discharge path the impedance of which is substantially determined by its associated resistor means;

the variation of the impedance of the discharge paths formed by said parallel arranged impedance means and said second resistor means causing said capacitor means to discharge at a corresponding rate effecting a corresponding output signal repetition rate to be coupled to said output means.

2. A pulse generator comprising:

an active element having at least three electrodes;

feedback means coupling a first and a second of said electrodes for causing said active element to oscillate at a predetermined pulse repetition rate;

means coupling the third of said electrodes to a reference potential;

said feedback means including a capacitor means serially coupled between said first and second electrodes;

at least two parallel arranged impedance means common coupled at one end to said first electrode and to said capacitor means for forming a discharge path for said capacitor means;

means separately coupled to each of said parallel arranged impedance means for receiving different combinations of alternative first and second different voltage level digital signals;

each of said parallel arranged impedance means including a switching means responsive to said first and second digital signals for switching each of said parallel arranged impedance means in or out of said discharge path for changing the equivalent resistance of said discharge path;

said predetermined pulse repetition rate determined by the respectively predetermined equivalent resistance of said discharge path as determined by said switching means.

3. The apparatus of claim 2 wherein said feedback means includes a multiwinding transformer means having at least a first and a second winding means;

said first winding means coupling said capacitor means at the opposite end of said capacitor means from said common coupled parallel arranged impedance means to a first reference potential;

a first impedance means electrically intermediate the common coupled end of said capacitor means and of said parallel arranged impedance means and said first electrode;

said second winding means coupling said second electrode to a second reference potential through a second impedance means;

a first capacitor means coupling the junction of said second winding means and said second impedance means to a third reference potential.

4. The apparatus of claim 3 wherein said transformer means further includes a third winding means, one end of which is coupled to a fourth reference potential and the other end of which is coupled to a utilization circuit.

5. The apparatus of claim 4 wherein each of said parallel arranged impedance means includes said switching means and a serially arranged resistor means, said switching means comprising a diode means;

a common resistor means coupling the common coupled end of said serially arranged diode means and resistor means to a fifth reference potential, each of the opposite ends of each of said serially arranged diode means and resistor means each separately coupled by a separate resistor means and a separate diode means to a sixth and a seventh reference potential, respectively;

the first of said digital signals reverse biasing the associated diode of a coupled one of said parallel arranged impedance means for causing such impedance means to appear as a high impedance discharge path to said capacitor means for effecting said predetermined equivalent resistance of said discharge path for producing said predetermined pulse repetition rate.

6. In combination with a blocking oscillator circuit, comprising:

at least one transistor having a pair of output electrodes and a control electrode;

transformer means having primary and secondary winding means;

means coupling said primary winding means and said output electrodes in series circuit between a first and a second reference potential;

a frequency control circuit comprising, a timing capacitor, means coupling said capacitor intermediate said secondary winding means and said control electrode for regeneratively coupling signals to said control electrode for causing oscillations;

means coupling the opposite end of said secondary winding means from said capacitor means to one of said reference potentials;

sets of serially coupled unidirectional current control means and resistor means;

means intercoupling at one end said sets in parallel circuit and to said control electrode;

means adapting said sets for separately receiving different combinations of alternative first and second different voltage level digital signals, one of said signals reverse biasing the coupled current control means for causing it to appear as a high impedance to said capacitor whereby the discharging rate of said capacitor is dependent upon the particular combination of said digital signals applied to said sets.

7. In combination with a blocking oscillator circuit, comprising:

at least one transistor having a pair of output electrodes and a control electrode;

transformer means having primary and secondary winding means;

means coupling said primary winding means and said output electrodes in series circuit between a first and a second reference potential;

a frequency control circuit comprising, a timing capacitor, means coupling said capacitor intermediate said secondary winding means and said control electrode for controlling the charging rate of said capacitor;

means coupling the opposite end of said secondary winding means from said capacitor means to one of said reference potentials;

a plurality of input circuits each comprising serially intercoupled directional current control means and resistor means, biasing means for maintaining said current control means normally non-conducting;

means coupling said input circuits at one end in parallel circuit and to said control electrode;

means for selectively applying alternative first and second different voltage level digital signals to said input circuits for rendering said current control means conductive so that the discharging rate of said capacitor is dependent upon the particular combination of said digital signals applied to said input circuits.

References Cited by the Examiner

UNITED STATES PATENTS

| | | | |
|---|---|---|---|
| 2,964,708 | 12/60 | Steele | 331—149 X |
| 3,012,237 | 12/61 | McCoy | 331—112 X |
| 3,061,795 | 10/62 | Byrd et al. | 331—112 X |
| 3,067,393 | 12/62 | Murray | 331—112 X |

OTHER REFERENCES

Eckess et al.: "Transistor Pulse Generators," in Electronics, pages 132–133, November 1955.

ROY LAKE, *Primary Examiner.*

JOHN KOMINSKI, *Examiner.*